United States Patent
Lin et al.

(10) Patent No.: US 10,048,742 B2
(45) Date of Patent: Aug. 14, 2018

(54) INTEGRATED CIRCUIT AND ELECTRONIC DEVICE

(71) Applicant: MEDIATEK INC., Hsin-Chu (TW)

(72) Inventors: Chih-Ching Lin, Hualien County (TW); Yi-Ping Kao, Taichung (TW); Chun-Sung Su, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 677 days.

(21) Appl. No.: 14/555,586

(22) Filed: Nov. 27, 2014

(65) Prior Publication Data

US 2015/0200565 A1    Jul. 16, 2015

Related U.S. Application Data

(60) Provisional application No. 61/928,098, filed on Jan. 16, 2014.

(51) Int. Cl.
*G06F 1/32* (2006.01)
*H01L 23/528* (2006.01)

(52) U.S. Cl.
CPC .......... *G06F 1/3287* (2013.01); *G06F 1/3234* (2013.01); *H01L 23/5286* (2013.01); *Y02D 10/171* (2018.01); *Y10T 307/305* (2015.04); *Y10T 307/391* (2015.04)

(58) Field of Classification Search
CPC .......... G06F 1/32; G06F 1/263; G06F 1/3287; H01L 23/5286; Y02B 60/1278; Y02B 60/1282; Y10T 307/305; Y10T 307/391
See application file for complete search history.

(56) References Cited

U.S. PATENT DOCUMENTS

| | | | | |
|---|---|---|---|---|
| 8,350,409 B2* | 1/2013 | Yamaoka | ............ | G06F 1/32 257/207 |
| 8,892,930 B2* | 11/2014 | Yeh | ............ | G06F 1/3203 326/62 |
| 9,471,121 B2* | 10/2016 | Saha | ............ | G06F 1/26 |
| 9,563,263 B2* | 2/2017 | Maiyuran | ............ | G06F 1/324 |
| 2005/0064829 A1* | 3/2005 | Kang | ............ | H04W 52/028 455/127.1 |
| 2009/0259982 A1* | 10/2009 | Verbeure | ............ | G06F 17/505 716/129 |
| 2009/0315399 A1* | 12/2009 | Shikata | ............ | G06F 1/3203 307/38 |

FOREIGN PATENT DOCUMENTS

| | | |
|---|---|---|
| CN | 101859172 A | 10/2010 |
| CN | 103324268 A | 9/2013 |
| WO | WO 2013068205 A1 * 5/2013 | ......... H03K 19/0008 |

* cited by examiner

*Primary Examiner* — Ryan Johnson
(74) *Attorney, Agent, or Firm* — Han IP PLLC; Andy M. Han

(57) ABSTRACT

The present invention provides an integrated circuit. The integrated circuit comprises: a plurality of core power sources; and a plurality of core power domains, coupled to the core power sources, respectively; wherein the core power domains are overlapped with each other.

15 Claims, 3 Drawing Sheets

US 10,048,742 B2

INTEGRATED CIRCUIT AND ELECTRONIC DEVICE

CROSS REFERENCE TO RELATED APPLICATIONS

This application claims the benefit of U.S. patent application Ser. No. 61/928,098, filed on Jan. 16, 2014 and included herein by reference.

BACKGROUND

The disclosed embodiments of the present invention relate to an integrated circuit, and more particularly, to an integrated circuit which comprises a plurality of core power domains overlapped with each other.

Please refer to FIG. 1. FIG. 1 is a simplified diagram of a conventional integrated circuit 100. As shown in FIG. 1, the integrated circuit 100 comprises: a core power source Vcore, a core power domain 102, and three power domains 110, 120, 130, wherein the power domains 110, 120, 130 are all coupled to the core power source Vcore. Since there is only one core power source Vcore and the core power source Vcore is required to be always turned on, no element in the power domains 110, 120, 130 can be turned off or drop voltage to reduce power consumption efficiently.

SUMMARY

In accordance with exemplary embodiments of the present invention, an integrated circuit is proposed to solve the above-mentioned problem.

According to an aspect of the present invention, an exemplary integrated circuit is disclosed. The electronic device comprises: a plurality of core power sources; and a plurality of core power domains, coupled to the core power sources, respectively; wherein the core power domains are overlapped with each other.

According to an aspect of the present invention, an exemplary electronic device is disclosed. The electronic device comprises: a cell group, comprising a first always-on cell and a second always-on cell; a plurality of core power sources, coupled to the first always-on cell and the second always-on cell respectively; and a plurality of core power domains, coupled to the core power sources respectively, wherein the core power domains are overlapped with each other.

Briefly summarized, compared with prior art, since the integrated circuit and the electronic device disclosed by the present invention comprises a plurality of core power domains overlapped with each other, some always-on cells can be turned off for efficient power reduction.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
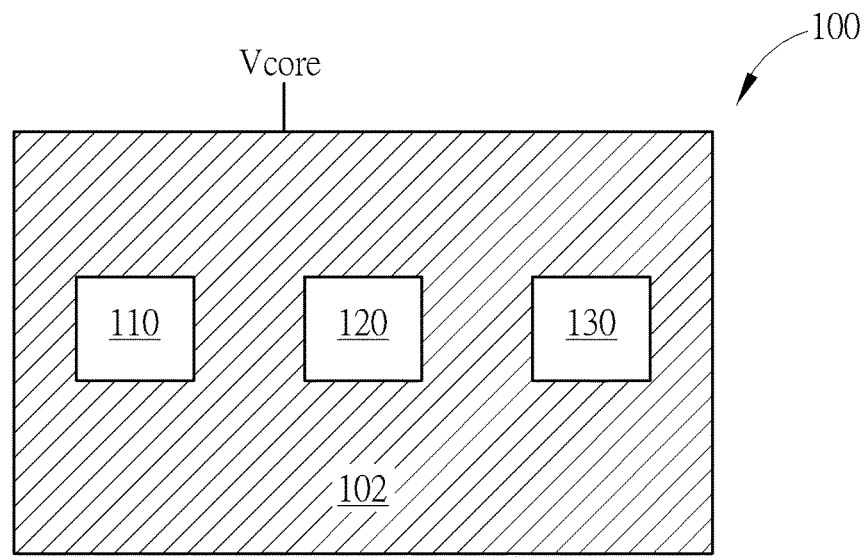
FIG. 1 is a simplified diagram of a conventional integrated circuit.
Figure 2:
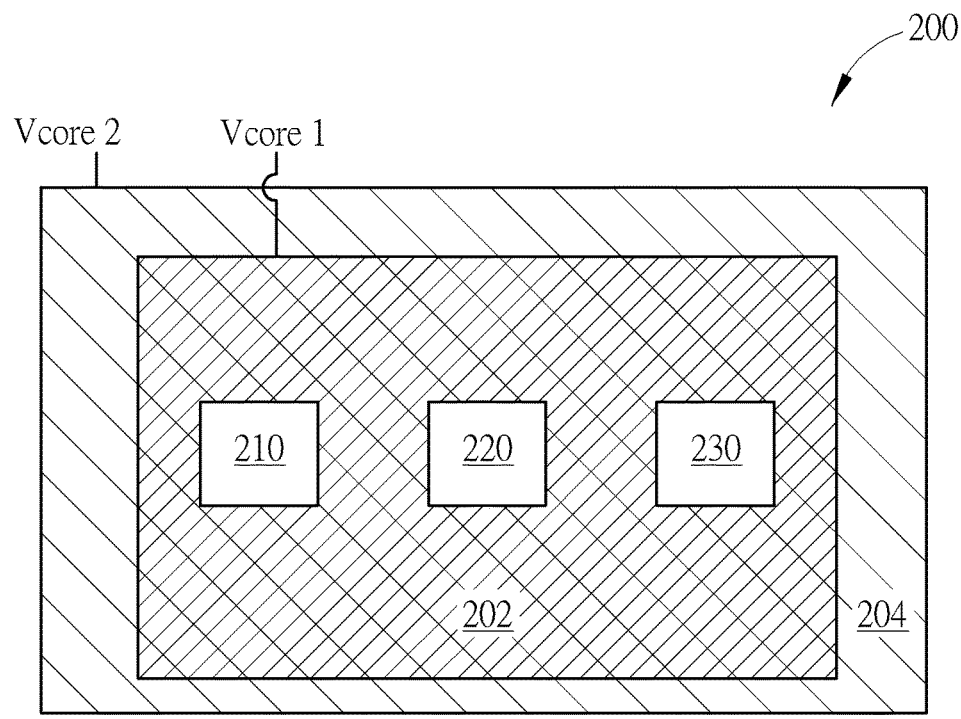
FIG. 2 is a simplified diagram of an integrated circuit according to a first exemplary embodiment of the present invention.

Please refer to FIG. 2. FIG. 2 is a simplified diagram of an integrated circuit 200 according to a first exemplary embodiment of the present invention, wherein the integrated circuit 200 can be an SOC integrated circuit. As shown in FIG. 2, the integrated circuit 200 comprises: two core power sources Vcore1, Vcore2, two core power domains 202, 204, and three power domains 210, 220, 230, wherein the core power sources Vcore1 and Vcore2 can be digital core power sources. Please note that the above embodiment is only for an illustrative purpose and is not meant to be a limitation of the present invention. For example, the number of the core power sources and the power domains can be changed according to different design requirements.

The core power domain 202 is coupled to the core power source Vcore1, and the core power domain 204 is coupled to the core power source Vcore2, wherein the core power domains 202, 204 are overlapped with each other, and the core power source Vcore1 is capable of being turned off when the second core power source Vcore2 is required to be turned on. The power domains 210, 220, 230 are coupled to both the core power sources Vcore1 and Vcore2, wherein at least one of the power domains 210, 220, 230 comprises a plurality of always-on cells (xCell) coupled to the core power sources Vcore1 and Vcore2, respectively. Since the core power domains 202, 204 are overlapped with each other and the core power source Vcore1 is capable of being turned off when the second core power source Vcore2 is required to be turned on, some of the always-on cells can be turned off for efficient power reduction.

Figure 3:
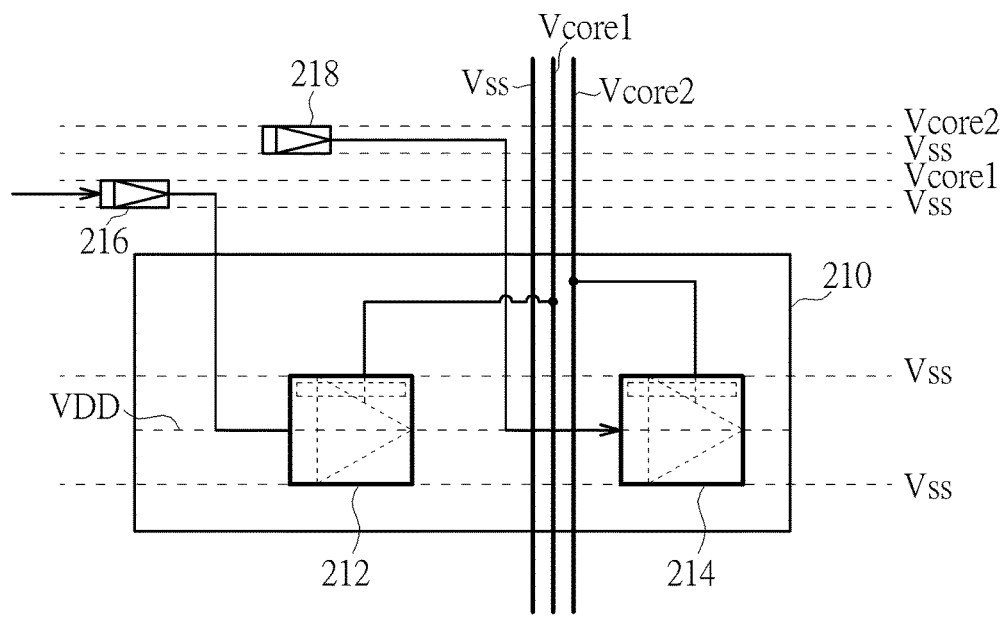
FIG. 3 is a simplified diagram of the power domain in FIG. 2.

For example, please refer to FIG. 3. FIG. 3 is a simplified diagram of the power domain 210. As shown in FIG. 3, the power domain 210 comprises: a first always-on cell 212 and a second always-on cell 214, wherein the core power source Vcore1 is coupled to the first always-on cell 212, and the second core power source Vcore2 is coupled to the second always-on cell 214. In addition, the first always-on cell 212 and the second always-on cell 214 are coupled to power supplies VSS, VDD, and external buffers 216, 218, respectively. Please note that the above embodiment is only for an illustrative purpose and is not meant to be a limitation of the present invention. For example, the number of the always-on cells can be changed according to different design requirements.

Figure 4:
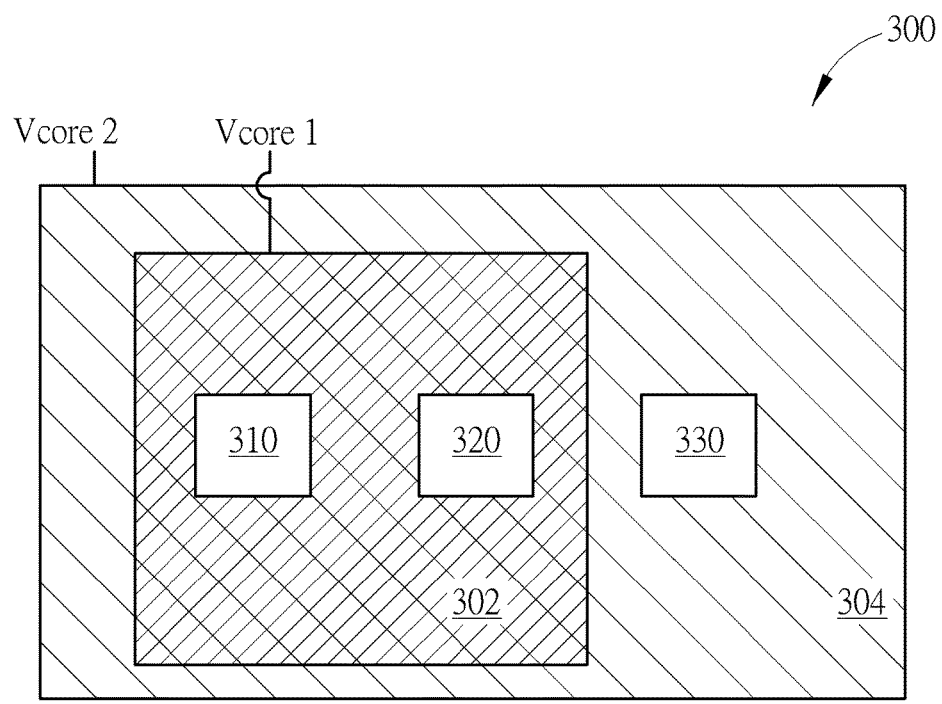
FIG. 4 is a simplified diagram of an integrated circuit according to a second exemplary embodiment of the present invention.

Please refer to FIG. 4. FIG. 4 is a simplified diagram of an electronic device 300 according to a second exemplary embodiment of the present invention, wherein the electronic device 300 can be an SOC integrated circuit. As shown in FIG. 4, the electronic device 300 comprises: two core power sources Vcore1, Vcore2, two core power domains 302, 304, and three power domains 310, 320, 330, wherein the core power sources Vcore1 and Vcore2 can be digital core power sources. Please note that the above embodiment is only for an illustrative purpose and is not meant to be a limitation of the present invention. For example, the number of the core power sources and the power domains can be changed according to different design requirements.

The core power domain 302 is coupled to the core power source Vcore1, and the core power domain 304 is coupled to the core power source Vcore2, wherein the core power domains 302, 304 are overlapped with each other, and the core power source Vcore1 is capable of being turned off when the second core power source Vcore2 is required to be turned on. The power domains 310, 320 are coupled to both the core power sources Vcore1 and Vcore2, and the power domains 330 is only coupled to the core power source Vcore2, wherein at least one of the power domains 310 and 320 comprises a plurality of always-on cells coupled to the core power sources Vcore1 and Vcore2, respectively. Since the core power domains 202, 204 are overlapped with each other and the core power source Vcore1 is capable of being turned off when the second core power source Vcore2 is required to be turned on, some of the always-on cells can be turned off for efficient power reduction.

Figure 5:
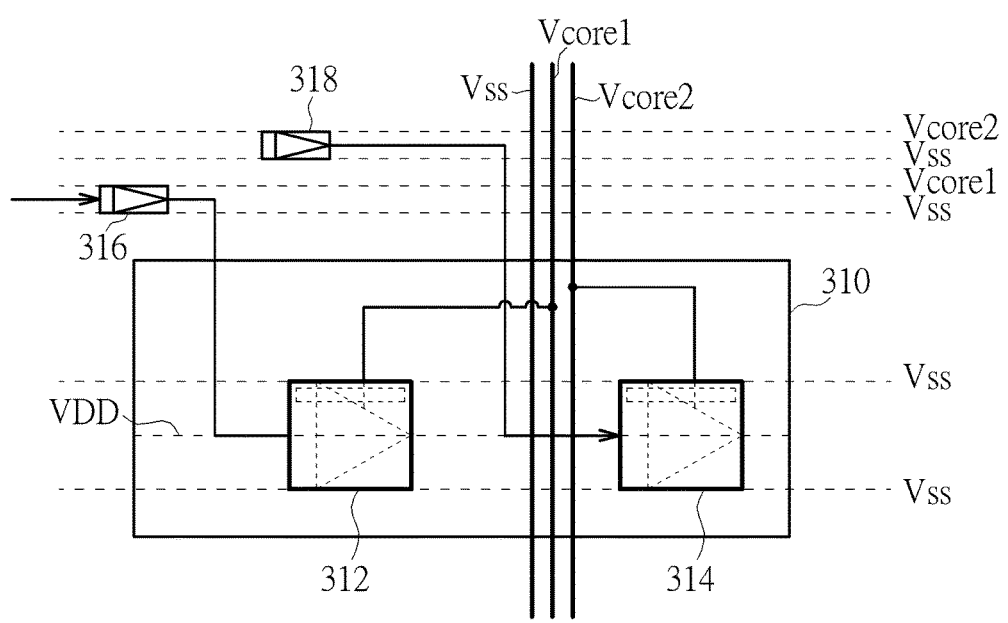
FIG. 5 is a simplified diagram of the power domain in FIG. 4.

For example, please refer to FIG. 5. FIG. 5 is a simplified diagram of the power domain 310. As shown in FIG. 3, the power domain 310 comprises: a first always-on cell 312 and a second always-on cell 314, wherein the core power source Vcore1 is coupled to the first always-on cell 312, and the second core power source Vcore2 is coupled to the second always-on cell 314. In addition, the first always-on cell 312 and the second always-on cell 314 are coupled to a power supplies VSS, VDD, and external buffers 316, 318, respectively. Please note that the above embodiment is only for an illustrative purpose and is not meant to be a limitation of the present invention. For example, the number of the always-on cells can be changed according to different design requirements.

The present invention also discloses an electronic device which includes the integrated circuit in the first exemplary embodiment or the second exemplary embodiment, wherein a cell group includes the first always-on cell 312 and the second always-on cell 314 thereto. Applicants will not repeat the details again.

Briefly summarized, compared with prior art, since the electronic device disclosed by the present invention comprises a plurality of core power domains overlapped with each other, some always-on cells can be turned off for efficient power reduction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
    a plurality of core power sources comprising at least a first core power source and a second core power source, the second core power source required to stay turned on and the first core power source capable of being turned on and off;
    a plurality of core power domains comprising at least a first core power domain and a second core power domain, the first core power domain powered by the first core power source and the second core power domain powered by the second core power source; and
    a plurality of power domains in the plurality of core power domains with at least one power domain of the plurality of power domains being in both the first core power domain and the second core power domain such that the at least one power domain is coupled to both the first core power source and the second core power source, the at least one power domain comprising at least a first always-on cell and a second always-on cell,
    wherein the first always-on cell is coupled to the first core power source, and
    wherein the second always-on cell is coupled to the second core power source.

2. The integrated circuit of claim 1, wherein at least another power domain of the plurality of power domains is in either but not both of the first core power domain and the second core power domain such that the at least another power domain is powered by either but not both of the first core power source and the second core power source.

3. The integrated circuit of claim 1, wherein the first always-on cell is switched off by turning off the first core power source while the second always-on cell stays on as the second core power source is required to stay turned on, and wherein the first always-on cell is switched on by turning on the first core power source.

4. The integrated circuit of claim 1, wherein at least one of the first and second core power sources comprises a digital core power source.

5. The integrated circuit of claim 1, wherein the plurality of core power domains and the plurality of power domains are part of a system-on-chip (SOC) integrated circuit.

6. An electronic device, comprising:
    an integrated circuit comprising:
        a plurality of core power sources comprising at least a first core power source and a second core power source, the second core power source required to stay turned on and the first core power source capable of being turned on and off;
        a plurality of core power domains comprising at least a first core power domain and a second core power domain, the first core power domain powered by the first core power source and the second core power domain powered by the second core power source; and
        a power domain that is in both the first core power domain and the second core power domain such that the power domain is coupled to both the first core power source and the second core power source, the power domain comprising a cell group that comprises at least a first always-on cell and a second always-on cell,
    wherein the first always-on cell is coupled to the first core power source, and
    wherein the second always-on cell is coupled to the second core power source.

7. The electronic device of claim 6, wherein the integrated circuit further comprises at least another power domain that is in either but not both of the first core power domain and the second core power domain such that the at least another power domain is powered by either but not both of the first core power source and the second core power source.

8. The electronic device of claim 6, wherein the first always-on cell is off by turning off the first core power source while the second always-on cell stays on as the second core power source is required to stay turned on, and wherein the first always-on cell is switched on by turning on the first core power source.

9. The electronic device of claim 6, wherein at least one of the first and second core power sources comprises a digital core power source.

10. The electronic device of claim 6, wherein the integrated circuit comprises a system-on-chip (SOC) integrated circuit.

11. An integrated circuit, comprising:
   a plurality of core power sources comprising at least a first core power source and a second core power source, the second core power source required to stay turned on and the first core power source capable of being turned on and off;
   a plurality of core power domains comprising at least a first core power domain and a second core power domain, the first core power domain powered by the first core power source and the second core power domain powered by the second core power source; and
   a power domain that is in both the first core power domain and the second core power domain such that the power domain is coupled to both the first core power source and the second core power source,
   wherein a first portion of the power domain coupled to the first core power source is switched off when the first core power source is turned off, and
   wherein a second portion of the power domain coupled to the second core power source stays on when the first core power source is turned off as the second core power source is required to stay turned on.

12. The integrated circuit of claim 11, wherein the first portion of the power domain comprises a first always-on cell coupled to the first core power source, and wherein the second portion of the power domain comprises a second always-on cell coupled to the second core power source.

13. The integrated circuit of claim 12, wherein the first always-on cell is switched off by turning off the first core power source while the second always-on cell stays on as the second core power source is required to stay turned on, and wherein the first always-on cell is switched on by turning on the first core power source.

14. The integrated circuit of claim 11, further comprising:
   at least another power domain that is in either but not both of the first core power domain and the second core power domain such that the at least another power domain is powered by either but not both of the first core power source and the second core power source.

15. The integrated circuit of claim 14, wherein the second core power domain is larger the first core power domain such that the at least another power domain is in the second core power domain but not in the first core power domain, and wherein the power domain constitutes an overlap between the first core power domain and the second core power domain.

* * * * *